(12) United States Patent
Zhang

(10) Patent No.: US 12,021,128 B2
(45) Date of Patent: Jun. 25, 2024

(54) BIDIRECTIONAL POWER DEVICE AND METHOD FOR MANUFACTURING THE SAME

(71) Applicant: HANGZHOU SILAN MICROELECTRONICS CO., LTD., Hangzhou (CN)

(72) Inventor: Shaohua Zhang, Hangzhou (CN)

(73) Assignee: HANGZHOU SILAN MICROELECTRONICS CO., LTD., Hangzhou (CN)

( * ) Notice: Subject to any disclaimer, the term of this patent is extended or adjusted under 35 U.S.C. 154(b) by 162 days.

(21) Appl. No.: 17/600,758

(22) PCT Filed: Jan. 7, 2020

(86) PCT No.: PCT/CN2020/070770
§ 371 (c)(1),
(2) Date: Oct. 1, 2021

(87) PCT Pub. No.: WO2020/199707
PCT Pub. Date: Oct. 8, 2020

(65) Prior Publication Data
US 2022/0199794 A1 Jun. 23, 2022

(30) Foreign Application Priority Data
Apr. 3, 2019 (CN) .......................... 201910268168.3

(51) Int. Cl.
*H01L 29/423* (2006.01)
*H01L 29/06* (2006.01)
(Continued)

(52) U.S. Cl.
CPC ...... *H01L 29/4236* (2013.01); *H01L 29/0611* (2013.01); *H01L 29/1041* (2013.01);
(Continued)

(58) Field of Classification Search
CPC ............. H01L 29/4236; H01L 29/0611; H01L 29/1041; H01L 29/7834; H01L 29/0696;
(Continued)

(56) References Cited

U.S. PATENT DOCUMENTS

| 5,612,566 A | 3/1997 | Williams |
| 6,087,740 A | 7/2000 | Williams |

(Continued)

FOREIGN PATENT DOCUMENTS

| CN | 104051520 A | 9/2014 |
| CN | 108321192 A | 7/2018 |

(Continued)

OTHER PUBLICATIONS

International Search Report (including English translation) and Written Opinion for International Application No. PCT/CN2020/070770, dated Apr. 13, 2020, 9 pages.

*Primary Examiner* — Shahed Ahmed
(74) *Attorney, Agent, or Firm* — Westman, Champlin & Koehler, P.A.

(57) ABSTRACT

Disclosed are a bidirectional power device and a method for manufacturing the same. The bidirectional power device includes a semiconductor layer, a plurality of trenches located in the semiconductor layer, a gate dielectric layer located on an inner wall of each of the plurality of trenches, a control gate located at a lower portion of each of the plurality of trenches, a shield gate located at an upper portion of each of the plurality of trenches and an isolation layer located between the control gate and the shield gate. When the bidirectional power device is turned off, charges of a source region and a drain region are depleted by the shield gate through a shield dielectric layer, thereby improving voltage withstand property. When the bidirectional power device is turned on, the source region and/or the drain (Continued)

region and the semiconductor layer provide a low-impedance conduction path.

22 Claims, 11 Drawing Sheets

(51) Int. Cl.
*H01L 29/10* (2006.01)
*H01L 29/40* (2006.01)
*H01L 29/66* (2006.01)
*H01L 29/78* (2006.01)

(52) U.S. Cl.
CPC ...... *H01L 29/407* (2013.01); *H01L 29/66621* (2013.01); *H01L 29/7834* (2013.01)

(58) Field of Classification Search
CPC ............... H01L 29/1087; H01L 29/423; H01L 29/1033; H01L 29/42364; H01L 29/7831; H01L 29/66613–66628; H01L 29/7813; H01L 29/7825; H01L 29/42352; H01L 29/402–407
See application file for complete search history.

(56) References Cited

U.S. PATENT DOCUMENTS

| | | | |
|---|---|---|---|
| 9,129,889 B2 | 9/2015 | Padmanabhan et al. | |
| 9,502,550 B2 | 11/2016 | Padmanabhan et al. | |
| 2014/0054682 A1 | 2/2014 | Padmanabhan et al. | |
| 2014/0264369 A1* | 9/2014 | Padmanabhan | H01L 27/1211 |
| | | | 438/172 |
| 2015/0340482 A1 | 11/2015 | Padmanabhan et al. | |
| 2016/0020288 A1* | 1/2016 | Deng | H01L 29/7397 |
| | | | 257/330 |
| 2016/0247916 A1* | 8/2016 | Stefanov | H01L 29/086 |
| 2020/0243656 A1* | 7/2020 | Shibib | H01L 29/404 |

FOREIGN PATENT DOCUMENTS

| | | |
|---|---|---|
| CN | 110120416 A | 8/2019 |
| CN | 110137243 A | 8/2019 |

* cited by examiner

BIDIRECTIONAL POWER DEVICE AND METHOD FOR MANUFACTURING THE SAME

CROSS-REFERENCE TO RELATED APPLICATION

This Application is a Section 371 National Stage Application of International Application No. PCT/PCT/CN2020/070770, filed on Jan. 7, 2020 and published as WO/2020/199707 A1 on Oct. 8, 2020, not in English, which claims the priority to Chinese Patent Application No. CN201910268168.3, filed on Apr. 3, 2019 and is entitled, "Bidirectional Power Device and Method for Manufacturing the Same", the entire contents of which are hereby incorporated by reference in their entireties.

FIELD OF TECHNOLOGY

The present disclosure relates to a technical field of semiconductor manufacturing, in particular to a bidirectional power device and a method for manufacturing the same.

BACKGROUND

A power device is mainly used as, for example, a switch element or a rectifying element, in a high-power power supply circuit and a control circuit. In the power device, doped regions of different types form a PN junction so as to achieve a function of a diode or a transistor. The power device usually needs to carry a large electric current under a high voltage in use. On one hand, to satisfy the requirements of high-voltage applications, improve reliability and prolong the service life of the power device, the power device needs to have a high breakdown voltage. On the other hand, to reduce power consumption of the power device itself and heat produced by the power device, the power device needs to have a low on-resistance. In the power supply circuit, charging and discharging processes are frequently involved, and current flowing directions in charging and discharging processes are different, such that the power device is required to have a bidirectional conduction function.

Power devices of a bidirectional conduction type are disclosed in the U.S. Pat. Nos. 5,612,566 and 6,087,740, which provide a bidirectional power device including a substrate and a first output electrode and a second output electrode, wherein the first output electrode and the second output electrode are located on the substrate. The substrate is a P-type substrate or a P-type epitaxial layer or a P-type doped well region; and the two output electrodes each are composed of a lightly-doped N− region and a heavily-doped N+ region located in the lightly-doped N− region. When the power device is in a conducting state, a current flows from the second output electrode to the first output electrode when the first output electrode and the substrate are short-circuited, and the current flows from the first output electrode to the second output electrode when the second output electrode and the substrate are short-circuited.

However, voltage withstand property and on-resistance of the bidirectional power device are a pair of contradictory parameters. By reducing an impurity concentration of the lightly-doped N− region, the breakdown voltage may be improved and relatively good voltage withstand property may be obtained, however, the on-resistance may be increased, and therefore power consumption is increased due to the reduction of the impurity concentration of the lightly-doped N− region.

The bidirectional power device still needs to be further improved so as to take consideration of both requirements on the voltage withstand property and the on-resistance.

SUMMARY

In view of the problem above, an objective of the present disclosure is to provide a bidirectional power device and a method for manufacturing the same, wherein a control gate is located at a lower portion of each of a plurality of trenches, a shield gate is located at an upper portion of each of the plurality of trenches, and the shield gate is isolated from the control gate by an isolation layer so as to take consideration of both requirements on voltage withstand property and on-resistance.

In a first aspect, a bidirectional power device provided by the present disclosure comprises: a semiconductor layer; a plurality of trenches located in the semiconductor layer; a gate dielectric layer located on an inner wall of each of the plurality of trenches; a control gate located at a lower portion of each of the plurality of trenches; a shield gate located at an upper portion of each of the plurality of trenches; and an isolation layer located between the control gate and the shield gate, wherein the control gate is isolated from the semiconductor layer by the gate dielectric layer.

Preferably, the bidirectional power device further comprises: a source region and a drain region which are located in the semiconductor layer and are adjacent to the shield gate; and a channel region which is located in the semiconductor layer and is adjacent to the control gate.

Preferably, the source region and the drain region each extend from a first surface of the semiconductor layer and overlap with the control gate.

Preferably, a doping type of the semiconductor layer is a first doping type, doping types of the source region and the drain region are a second doping type, a doping type of the channel region is the first doping type or the second doping type, and the first doping type and the second doping type are contrary types.

Preferably, the bidirectional power device further comprises a shield dielectric layer located on an inner wall of each of the plurality of trenches, wherein the shield gate is isolated from the semiconductor layer by the shield dielectric layer.

Preferably, a thickness of the shield dielectric layer is 0.1~0.25 μm.

Preferably, a length of the shield gate is 0.6~1.2 μm.

Preferably, the thickness of the shield dielectric layer is greater than or equal to that of the gate dielectric layer.

Preferably, a width of the control gate is greater than that of the shield gate.

Preferably, each of the source region and the drain region has a length greater than a sum of the length of the shield gate and a length of the isolation layer, and less than a sum of the length of the shield gate, the length of the isolation layer and a length of the control gate.

Preferably, the semiconductor layer is one selected from a group of a semiconductor substrate itself, an epitaxial layer formed on the semiconductor substrate or a well region implanted in the semiconductor substrate.

Preferably, the bidirectional power device further comprises: a first contact, being in contact with the source region to form a first output electrode; a second contact, being in contact with the drain region to form a second output electrode; a third contact, being in contact with the semiconductor layer to form a substrate electrode; and a fourth contact, being in contact with the control gate and/or the shield gate to form a gate electrode.

Preferably, the bidirectional power device further comprises: a first contact region, which is located in the source region and has a doping concentration greater than that of the source region; an overlay dielectric layer, located on the first surface of the semiconductor layer; and a first through hole, penetrating through the overlay dielectric layer to extend to the source region, wherein the first contact is in contact with the source region through the first through hole and the first contact region.

Preferably, the bidirectional power device further comprises: a second contact region, which is located in the drain region and has a doping concentration greater than that of the drain region; and a second through hole, penetrating through the overlay dielectric layer to extend to the drain region, wherein the second contact is in contact with the drain region through the second through hole and the second contact region.

Preferably, the bidirectional power device further comprises: a third contact region, which is located in the semiconductor layer and is proximal to the first surface of the semiconductor layer, and has a doping concentration greater than that of the semiconductor layer; and a third through hole, penetrating through the overlay dielectric layer to extend to the semiconductor layer, wherein the third contact is in contact with the semiconductor layer through the third through hole and the third contact region.

Preferably, a fourth through hole is configured to penetrate through the overlay dielectric layer to extend to the control gate and/or the shield gate.

Preferably, the third contact is located on a second surface of the semiconductor layer.

Preferably, the bidirectional power device further comprises a routing layer, including a first wire, a second wire, a third wire and a fourth wire, which are electrically connected to the first output electrode, the second output electrode, the substrate electrode and the gate electrode, respectively, through a plurality of conductive vias.

Preferably, the bidirectional power device further comprises a plurality of metal solder balls, which are located on the routing layer, and are electrically connected to the first output electrode, the second output electrode, the substrate electrode and the gate electrode through the routing layer, respectively.

Preferably, the shield gate is electrically connected to the control gate.

Preferably, the shield gate is electrically connected to the semiconductor layer.

Preferably, when the bidirectional power device is turned on, the substrate electrode is electrically connected to either of the first output electrode and the second output electrode to select a direction of a current from two direction.

Preferably, when the substrate electrode is electrically connected to the first output electrode, the current flows from the second output electrode to the first output electrode; and when the substrate electrode is electrically connected to the second output electrode, the current flows from the first output electrode to the second output electrode.

According to a second aspect of the present disclosure, a bidirectional power device is provided and comprises a plurality of cell structures, wherein each one of the plurality of cell structures is the bidirectional power device described as above; source regions in the plurality of cell structures are electrically connected together, and drain regions in the plurality of cell structures are electrically connected together.

In a third aspect, the present disclosure provides a method for manufacturing a bidirectional power device. The method comprises: forming a plurality of trenches in a semiconductor layer, forming a gate dielectric layer on an inner wall of each of the plurality of trenches, forming a control gate at a lower portion of each of the plurality of trenches, forming a shield gate at an upper portion of each of the plurality of trenches and forming an isolation layer between the control gate and the shield gate, wherein the control gate is isolated from the semiconductor layer by the gate dielectric layer.

Preferably, the method further comprises: forming, in the semiconductor layer, a source region and a drain region which are adjacent to the shield gate; and forming, in the semiconductor layer, a channel region which is adjacent to the control gate.

Preferably, the source region and the drain region each extend from a first surface of the semiconductor layer and overlap with the control gate.

Preferably, the method further comprises: forming a shield dielectric layer on an inner wall of each of the plurality of trenches, and isolating the shield gate from the semiconductor layer by the shield dielectric layer.

Preferably, a thickness of the shield dielectric layer is 0.1~0.25 µm.

Preferably, a length of the shield gate is 0.6~1.2 µm.

Preferably, the thickness of the shield dielectric layer is greater than or equal to that of the gate dielectric layer.

Preferably, a width of the control gate is greater than that of the shield gate.

Preferably, each of the source region and the drain region has a length greater than a sum of the length of the shield gate and a length of the isolation layer, and less than a sum of the length of the shield gate, the length of the isolation layer and a length of the control gate.

Preferably, the method further comprises: forming a first contact, which is in contact with the source region and configured to form a first output electrode; forming a second contact, which is in contact with the drain region and configured to form a second output electrode; forming a third contact which is in contact with the semiconductor layer and configured to form a substrate electrode; and forming a fourth contact, which is in contact with the control gate and/or the shield gate and configured to form a gate electrode.

Preferably, the steps for forming the first contact, the second contact and the fourth contact comprise:
  forming a first contact region and a second contact region in the source region and the drain region, respectively;
  forming an overlay dielectric layer on a first surface of the semiconductor layer;
  forming a first through hole penetrating through the overlay dielectric layer to extend to the source region, a second through hole penetrating through the overlay dielectric layer to extend to the drain region, and a fourth through hole; and
  filling the overlay dielectric layer with a metal layer, wherein the metal layer filled in the first through hole, the second through hole and the fourth through hole forms the first contact, the second contact and the fourth contact, respectively,
  wherein the first contact is in contact with the source region through the first through hole and the first contact region, the second contact is in contact with the drain region through the second through hole and the second contact region, and the fourth contact is in contact with the control gate and/or the shield gate through the fourth through hole.

Preferably, the step for forming the third contact comprises: forming a third contact region in the semiconductor layer, wherein the third contact region is proximal to the first surface of the semiconductor layer; forming a third through hole which penetrates through the overlay dielectric layer to extend to the semiconductor layer; and filling the overlay dielectric layer with the metal layer, wherein the metal layer filled in the third through hole forms the third contact, wherein the third contact is in contact with the semiconductor layer through the third through hole and the third contact region.

Preferably, the step for forming the third contact comprises: forming a substrate on a second surface of the semiconductor layer; and forming the third contact on the substrate by an evaporation process of a metal layer; wherein the third contact is in contact with the semiconductor layer.

Preferably, the method further comprises: forming a routing layer on a surface of the bidirectional power device, wherein the routing layer comprises a first wire, a second wire, a third wire and a fourth wire, which are electrically connected to the first output electrode, the second output electrode, the substrate electrode and the gate electrode, respectively, through a plurality of conductive vias.

Preferably, the method further comprises: forming a plurality of metal solder balls on the routing layer, wherein the plurality of metal solder balls are electrically connected to the first output electrode, the second output electrode, the substrate electrode and the gate electrode through the routing layer.

Preferably, the method further comprises: electrically connecting the shield gate to the control gate.

Preferably, the method further comprises: electrically connecting the shield gate to the semiconductor layer.

Preferably, the method further comprises: when the bidirectional power device is turned on, the substrate electrode is electrically connected to either of the first output electrode and the second output electrode to select a direction of a current from two direction.

Preferably, when the substrate electrode is electrically connected to the first output electrode, the current flows from the second output electrode to the first output electrode; and when the substrate electrode is electrically connected to the second output electrode, the current flows from the first output electrode to the second output electrode.

According to the bidirectional power device and the method for manufacturing the bidirectional power device provided by embodiments of the present disclosure, the control gate and the shield gate are formed at the lower portion and the upper portion of each of the plurality of trenches, respectively, the control gate and the shield gate are isolated from each other, the control gate is isolated from the semiconductor layer by the gate dielectric layer, the shield gate is isolated from the source region and the drain region by the shield dielectric layer, and when the bidirectional power device is turned off, charges of the source region and the drain region are depleted by the shield gate through the shield dielectric layer, thereby improving voltage withstand property of the device; and when the bidirectional power device is turned on, the source region and/or the drain region, and the semiconductor layer provide a low-impedance conduction path.

Further, when the bidirectional power device is turned on, the substrate electrode is electrically connected to either of the first output electrode and the second output electrode to achieve bidirectional selection on the direction of the current. When the substrate electrode is electrically connected to the first output electrode, the current flows from the second output electrode to the first output electrode; and when the substrate electrode is electrically connected to the second output electrode, the current flows from the first output electrode to the second output electrode.

Further, different threshold voltages may be achieved by adjusting the thickness of the shield dielectric layer, the doping concentrations of the source region and the drain region, and the length of the shield gate.

Further, the channel region is adjacent to the control gate located at the lower portion of each of the plurality of trenches, such that a length of a channel may be reduced by decreasing the width of each of the plurality of trenches, thus further reducing a resistance of the channel.

Further, the substrate electrode, the first output electrode, the second output electrode and the gate electrode of the bidirectional power device are led to a surface of the semiconductor substrate by the routing layer, and the metal solder balls are formed on the routing layer. Due to use of a bumping process, wire bonding process in conventional packaging methods can be omitted, a parasitic inductance and a parasitic resistance of the packaging are reduced, and a packaging resistance of the bidirectional power device is reduced; and due to the absence of encapsulation with a molding compound, heat dissipation is much easier, power consumption is reduced, and reliability and safety of the bidirectional power device are improved.

Further, the bidirectional power device may be composed of the plurality of cell structures, the source regions of all the cell structures are electrically connected together to serve as the first output electrode, the drain regions thereof are electrically connected together to serve as the second output electrode, and the current capacity of the bidirectional power device can be improved by increasing the quantity of the cell structures.

BRIEF DESCRIPTION OF THE DRAWINGS

According to following description of embodiments of the present disclosure with reference to accompanying drawings, the above and other purposes, features and advantages of the present disclosure may be more clearly described. In the accompanying drawings.

DESCRIPTION OF THE EMBODIMENTS

Various embodiments of the present disclosure will be described below in more detail with reference to accompanying drawings. In each accompanying drawing, identical elements are indicated by identical or similar reference signs. For the sake of clearness, various portions in the accompanying drawings are not drawn in proportion.

Particular implementation modes of the present disclosure will be further described below in detail in conjunction with the accompanying drawings and embodiments.

Figure 1:
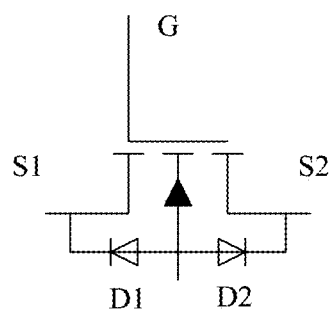
FIG. 1 illustrates a circuit schematic diagram of a bidirectional power device according to an embodiment of the present disclosure.

FIG. 1 illustrates a circuit schematic diagram of a bidirectional power device according to an embodiment of the present disclosure, and the bidirectional power device is formed by a transistor and has a bidirectional conduction function. As shown in FIG. 1, the bidirectional power device comprises a substrate Sub, two output electrodes S1 and S2 both located on the substrate Sub, and two parasitic transistors D1 and D2. When the output electrode S2 and the substrate Sub are short-circuited, and a high voltage is applied to a gate electrode G and is higher than a threshold voltage of the bidirectional power device, the bidirectional power device is turned on, and a current flows from the output electrode S1 to the output electrode S2; when the output electrode S1 and the substrate Sub are short-circuited, and a high voltage is applied to the gate electrode G and is higher than the threshold voltage of the bidirectional power device, the bidirectional power device is turned on, and the current flows from the output electrode S2 to the output electrode S1; when the substrate Sub is connected to a zero voltage, and a low voltage is applied to the gate electrode G and is lower than the threshold voltage, and the bidirectional power device is turned off.

First Embodiment

Figure 2:
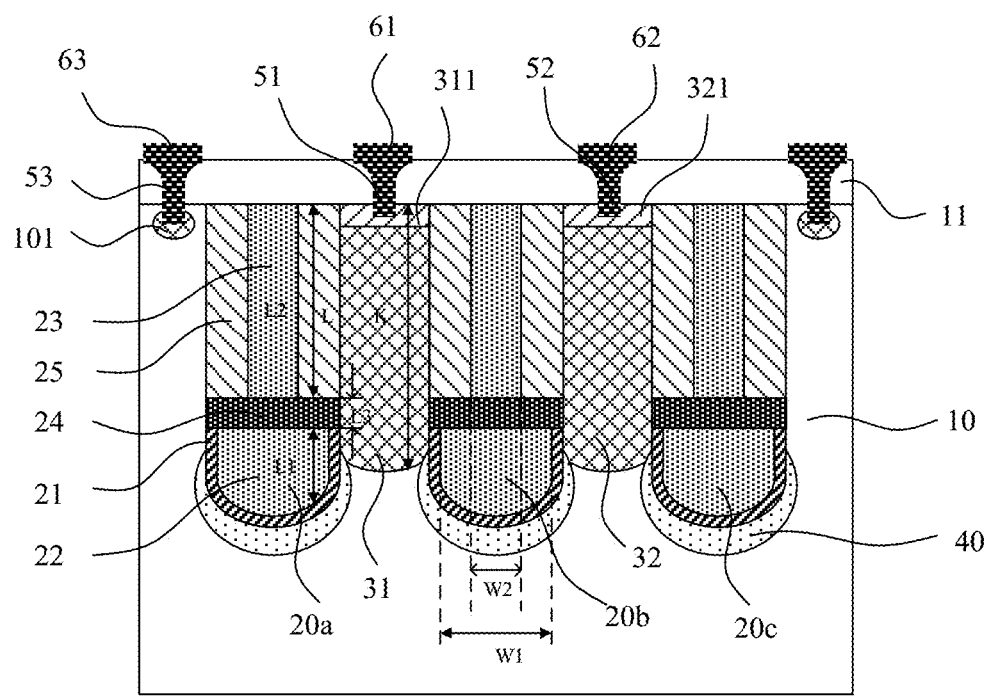
FIGS. 2-4 respectively illustrate sectional views of different cross sections and a top view of the bidirectional power device according to a first embodiment of the present disclosure.
Figure 3:
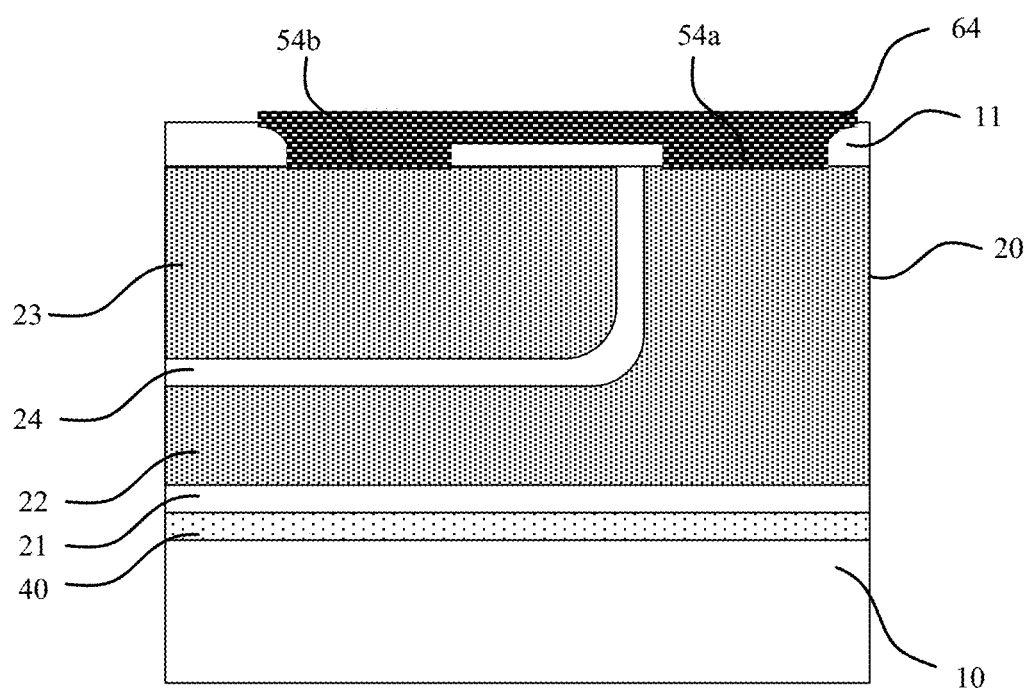
Figure 4:
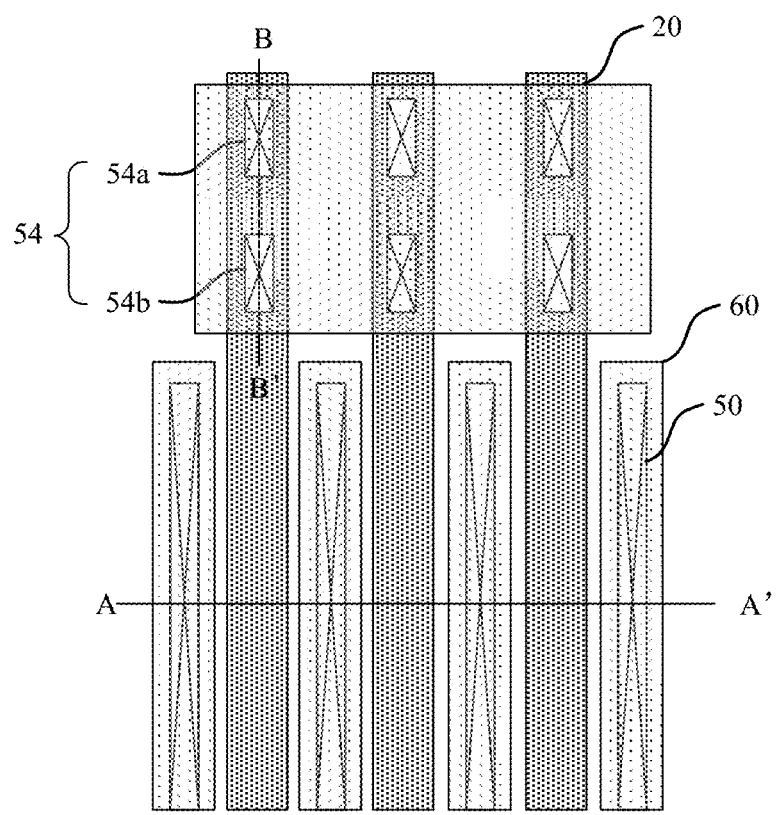

FIGS. 2-4 respectively illustrate sectional views and a top view of a bidirectional power device according to a first embodiment of the present disclosure, wherein FIG. 2 is the sectional view obtained along an AA' line of the top view shown in FIG. 4, and FIG. 3 is the sectional view obtained along a BB' line of the top view shown FIG. 4. In this embodiment, the bidirectional power device is a plurality of trenches-type device, and may be a metal-oxide-semiconductor field effect transistor (MOSFET), an insulated gate bipolar transistor (IGBT) device or a diode. An N-type MOSFET is taken as an example in description below. However, the present disclosure is not limited to such example.

The FIG. 2 illustrates a schematic vertical structure diagram of only one cell structure included in the bidirectional power device. However, in an actual product, one or more cell structures may be arranged. With reference to FIGS. 2-4, the bidirectional power device comprises a semiconductor layer 10, a plurality of trenches 20 located in the semiconductor layer 10, a gate dielectric layer 21 located on an inner wall of each of the plurality of trenches 20, a control gate 22 located at a lower portion of each of the plurality of trenches 20, a shield gate 23 located at an upper portion of each of the plurality of trenches 20 and an isolation layer 24 located between the control gate 22 and the shield gate 23.

In this embodiment, the semiconductor layer 10 is, for example, a semiconductor substrate, an epitaxial layer formed on the semiconductor substrate or a well region implanted in the semiconductor substrate. A doping concentration of the semiconductor layer 10 is 7E14~E16 $cm^{-3}$. The semiconductor layer 10 is, for example, a silicon substrate, or an epitaxial layer formed on the silicon substrate, or a well region formed in the silicon substrate, and has a doping type of P. The semiconductor layer 10 has a same doping type as that of the silicon substrate. The semiconductor layer 10 has a first surface and a second surface opposite each other.

Wherein, the control gate 22 is isolated from the semiconductor layer 10 by the gate dielectric layer 21.

Further, the bidirectional power device further comprises a shield dielectric layer 25 located on the inner wall of each of the plurality of trenches 20, and the shield gate 23 is isolated from the semiconductor layer 10 by the shield dielectric layer 25.

In this embodiment, the gate dielectric layer 21, the isolation layer 24 and the shield dielectric layer 25 may be made from silicon dioxide, silicon nitride, or a composite structure of silicon dioxide and silicon nitride, and may be made from a same material or different materials.

A thickness of the gate dielectric layer 21 is 200~1,000 angstroms, i.e., 0.02~0.1 μm, and a thickness of the shield dielectric layer 25 is 1,000~2,500 angstroms, i.e., 0.1~0.25 μm. The thickness of the shield dielectric layer 25 is greater than or equal to that of the gate dielectric layer 21.

A width W1 of the control gate 22 is greater than a width W2 of the shield gate 23, and a length L1 of the control gate is less than a length L2 of the shield gate 23. The length L2 of the shield gate 23 is 0.6~1.2 μm.

Further, a source region 31 and a drain region 32 which extend in a longitudinal direction and have a doping type of N are formed in the semiconductor layer 10, and the source region 31 and the drain region 32 may be exchange with each other. A channel region 40 adjacent to the control gate 22 is formed in the semiconductor layer 10.

In this embodiment, a doping type of the semiconductor layer 10 is a first doping type, the doping types of the source region 31 and the drain region 32 are a second doping type, a doping type of the channel region 40 is the first doping type or the second doping type, and the first doping type and the second doping type are contrary types.

In this embodiment, the source region 31 and the drain region 32 each extend from the first surface of the semiconductor layer 10 and overlap with the control gate 22. A length K of each of the source region 31 and the drain region 32 extending in the semiconductor layer 10, is greater than the length L2 of the shield gate 23 extending in the semiconductor layer 10, and preferably, the length K is greater than a sum L2+L3 of the lengths of the shield gate 23 and the isolation layer 24 extending in the semiconductor layer 10, but less than a sum L1+L2+L3 of the lengths of the shield gate 23, the isolation layer 24 and the control gate 22 extending in the semiconductor layer 10, namely L2+L3<K<L1+L2+L3.

The shield gate 23 is isolated from the source region 31 and/or the drain region 32 by the shield dielectric layer 25. When the bidirectional power device is turned off, charges of the source region and the drain region are depleted by the shield gate through the shield dielectric layer, thereby improving the voltage withstand property of the device; and when the bidirectional power device is turned on, the source region, the drain region and the semiconductor layer provide a low-impedance conduction path. Different threshold voltages may be achieved by adjusting the thickness of the shield dielectric layer, the doping concentrations of the source region and the drain region and the length of the shield gate.

Since the channel region 40 is adjacent to the control gate 22 located at the lower portion of each of the plurality of trenches 20, a length of a channel may be reduced by decreasing a width of each of the plurality of trenches, thus further reducing a resistance of the channel.

Further, a first contact region 311 and a second contact region 321 are formed in the source region 31 and the drain region 32, respectively. A doping type of the first contact region 311 is same as that of the source region 31, and a doping concentration of the first contact region 311 is greater than that of the source region 31. A doping type of the second contact region 321 is same as that of the drain region 32, and a doping concentration of the second contact region 321 is greater than that of the drain region 32.

Further, a third contact region 101 is formed in the semiconductor layer 10, the third contact region 101 is proximal to the first surface of the semiconductor layer 10, wherein, a doping type of the third contact region 101 is same as that of the semiconductor layer 10, and a doping concentration of third contact region 101 is greater than that of the semiconductor layer 10.

Further, an overlay dielectric layer 11 is formed on the first surface of the semiconductor layer 10, and through holes 50 penetrating through the overlay dielectric layer 11 are formed. The through holes 50 comprise a first through hole 51, a second through hole 52, third through holes 53, and a fourth through hole 54. Wherein, the first through hole 51 is located on the source region 31, and penetrates through the overlay dielectric layer 11 to extend to the source region 31, and the second through hole is located on the drain region 32, and penetrates through the overlay dielectric layer 11 to extend to the drain region 32.

The third through holes 53 are located in two sides of said a plurality of trenches 20 and each penetrate through the overlay dielectric layer 11 to extend to the semiconductor layer 10.

The fourth through hole 54 is located on each of the plurality of trenches 20, and penetrates through the overlay dielectric layer 11 to extend to the control gate 22 and/or the shield gate 23 in each of the plurality of trenches 20.

In this embodiment, the overlay dielectric layer 11 may be undoped silicate glass (USG) and borophosphosilicate glass (BPSG).

A metal layer 60 is deposited on the overlay dielectric layer 11, and the metal layer 60 formed in the first through hole 51 to the fourth through hole 54 forms a first contact 61 to a first contact 64, respectively. The first contact 61 is in contact with the source region 31 through the first through hole 51 and the first contact region 311 to form a first output electrode S1, the second contact 62 is in contact with the drain region 32 through the second through hole 52 and the second contact region 321 to form a second output electrode S2, and the third contact 63 is in contact with the semiconductor layer 10 through the corresponding third through hole 53 and the corresponding third contact region 101 to form a substrate electrode Sub. As shown in FIG. 3, the fourth contact 64 is in contact with the control gate 22 and/or the shield gate 23 through the fourth through hole 54 to form a gate electrode. As shown in FIG. 4, two fourth through holes 54 includes a through hole 54a of the control gate 22 and a through hole 54b of the shield gate 23. In this embodiment, the control gate 22 is connected to the shield gate 23.

In this embodiment, the metal layer 60 may be made from titanium, titanium nitride, aluminum bronze, aluminum silicon copper or aluminum silicate.

One cell structure shown in FIG. 2 only includes three trenches, one source region and one drain region, however, an actual product may have more than one source regions 31 and more than one drain regions 32. As shown in FIG. 2, the three trenches are a first trench 20a, a second trench 20b and a third trench 20c, respectively. The first contact 61 leads the source region 31 to a surface of the semiconductor layer 10 to form the first output electrode S1, the second contact 62 leads the drain region 32 to the surface of the semiconductor layer 10 to form the second output electrode S2, the third contact 63 leads the semiconductor layer 10 to form the substrate electrode Sub, the fourth contacts 64 lead the control gate 22 and the shield gate 23 in each of the plurality of trenches 20 to the surface of the semiconductor layer 10 to form the gate electrode G, wherein, the control gate 22 is electrically connected to the shield gate 23. The first trench 20a and the third trench 20c are symmetrically arranged outside the source region 31 and the drain region 32. The first output electrode S1 and the second output electrode S2 are formed by leading the source region 31 and the drain region 32 to the surface of the semiconductor layer 10, respectively, and may be exchanged with each other.

When a voltage applied to the control gate 22 is greater than the threshold voltage, the bidirectional power device is turned on, there is a current flowing through the channel region in the second trench 20b, selection on a direction of the current is realized by selecting one of the output electrodes and connected the selected one of the output electrodes to the substrate electrode, for example: when the first output electrode S1 is connected to the substrate electrode Sub, the current flows from the second output electrode S2 to the first output electrode S1; when the second output electrode S2 is connected to the substrate electrode Sub, the current flows from the first output electrode S1 to the second output electrode S2.

When a voltage applied to the control gate 22 is less than the threshold voltage, the bidirectional power device is turned off, due to a fact that the control gate 22 is electrically connected to the shield gate 23, the voltage applied to the shield gate 23 at the moment is a low voltage, a high voltage is applied to the first output electrode S1 and the second output electrode S2, such that voltage differences are formed between the source region 31 and the shield gate 23 and between the drain region 32 and the shield gate 23. The shield gates 23 in the first trench 20a and the third trench 20c are configured to induce charges in the source region 31 and the drain region 32 through the shield dielectric layers 25, respectively, the source region and the drain region can be completely depleted finally by adjusting the thickness and a material of the shield dielectric layer 25 and impurity concentrations of the source region 31 and the drain region 32, thereby achieving a purpose of improving the voltage withstand property of the device. Since the impurity concentrations of the source region 31 and the drain region 32 are increased, a resistance of the device is greatly reduced.

Figure 5:
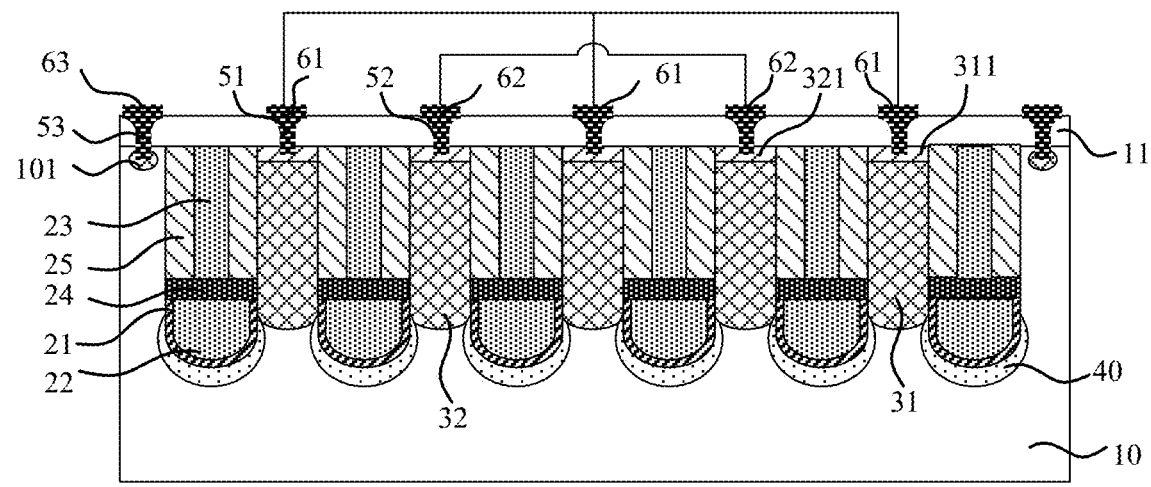
FIG. 5 illustrates a sectional view of a plurality of cell structures according to the first embodiment of the present disclosure.

FIG. 5 only illustrates a schematic diagram of two cell structures, a plurality of first contacts 61 are connected together to form the first output electrode S1, a plurality of second contacts 62 are connected together to form the second output electrode S2, thereby improving the electric current capacity of the device. Alternatively, for bidirectional power devices of other types, the number of cells can be increased, that is, two or more cell structures are selected to be connected in parallel, so as to improve the electric current capacity of the device.

Second Embodiment

Figure 6:
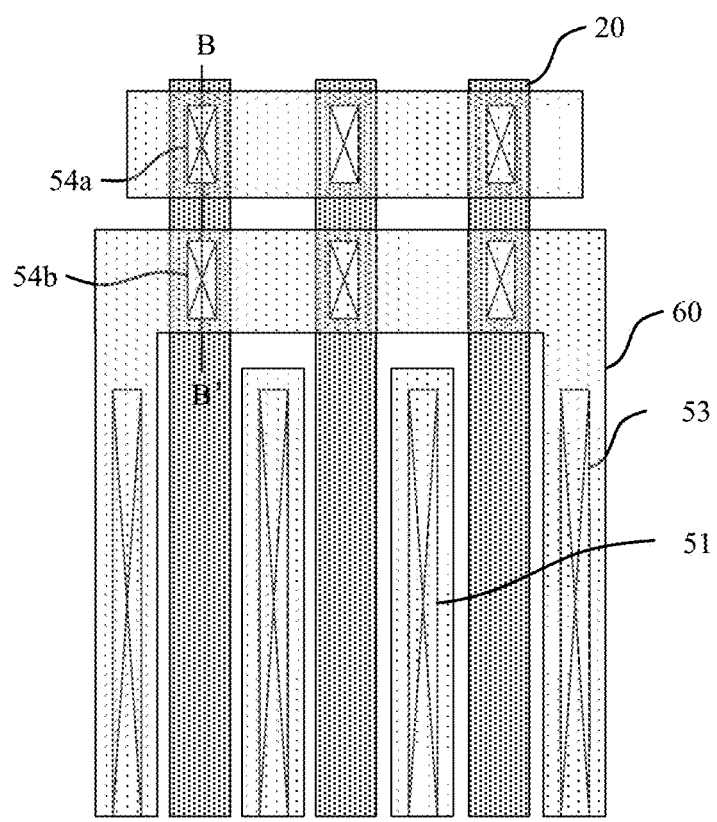
FIG. 6 illustrates a top view of a bidirectional power device according to a second embodiment of the present disclosure.

A technical solution according to this embodiment is basically identical to that of the first embodiment except for the following differences: in the first embodiment, the control gate 22 is connected to the shield gate 23, but in this embodiment, a shield gate 23 is connected to a semiconductor layer 10, as shown in FIG. 6, a through hole 54b of the shield gate 23 is connected to a through hole 53 of a substrate electrode, so as to electrically connect the shield gate 23 to the substrate electrode Sub.

In this embodiment, the other parts of the bidirectional power device are basically identical to those of the first embodiment, and will not be repeatedly described in particular structure.

In this embodiment, the control gate 22 is connected to the shield gate 23, the shield gate 23 overlaps with the source region 31 and the drain region 32, thus parasitic capacitances exist. When voltages applied to the control gate 22 and the shield gate 23 increase, the parasitic capacitances are charged, and the bidirectional power device is turned on. When the voltages applied to the control gate 22 and the shield gate 23 decrease, the parasitic capacitances are discharged, and the bidirectional power device is turned off. When the bidirectional power device is turned on and off at a high speed, charging and discharging time of the parasitic capacitances may reduce switching frequency, and charging and discharging of the parasitic capacitances may produce extra power consumption as well.

In the second embodiment, the shield gate 23 is connected to the semiconductor layer 10, a voltage applied to the shield gate 23 is fixed during a switching process of the device, thereby avoiding the charging and discharging of the parasitic capacitances caused by a change of the voltage applied to the shield gate 23, improving the switching frequency of the bidirectional power device, and reducing the power consumption. In some applications requiring that a bidirectional power device should not only have a resistance as low as possible, but also have low parasitic capacitances, the bidirectional power device according to this embodiment may serve as a switch which can be switched on and off at a high frequency.

Third Embodiment

Figure 7:
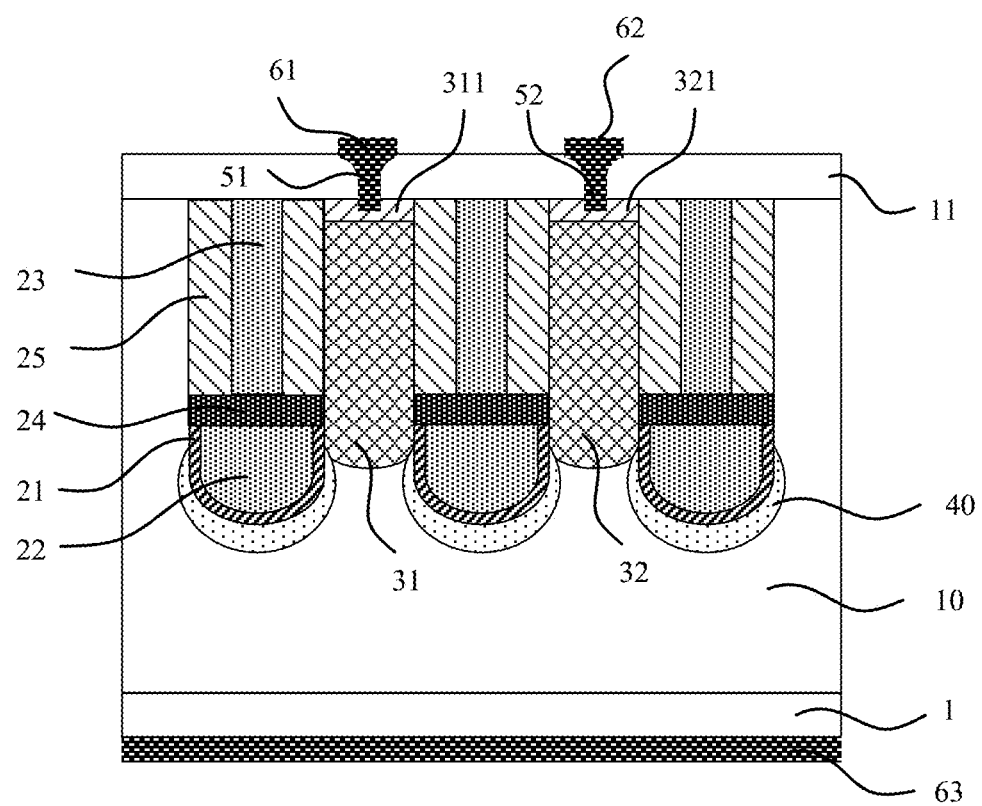
FIG. 7 illustrates a sectional view of a bidirectional power device according to a third embodiment of the present disclosure.

A technical solution according to this embodiment is basically identical to that of the first embodiment except for the following differences: in the first embodiment, the third contact 63 is formed on the first surface of the semiconductor layer 10, and is in contact with the semiconductor layer 10 through the corresponding third through hole 53 and the corresponding third contact region 101 to form the substrate electrode Sub. However, in this embodiment, a third contact 63 is formed on a second surface of a semiconductor layer 10, as shown in FIG. 7. Particularly, a bidirectional power device is formed on a substrate 1 with a relatively-high doping concentration, and then the third contact 63 is formed by an evaporation process of a metal layer forming a metal layer 60 at a back surface of the substrate 1.

In the first embodiment, the gate electrode, the substrate electrode, the first output electrode and the second output electrode of the bidirectional power device are all led out from the first surface of the semiconductor layer 10, and the bidirectional power device is suited for chip scale package (CSP).

In the third embodiment, the substrate electrode of the bidirectional power device is led out from the second surface of the semiconductor layer 10, such that the bidirectional power device may be suited for conventional device packaging forms (e.g., SOP8 and DIP8), and a capacity for heat dissipation of the bidirectional power device is improved as well.

In this embodiment, the other parts of the bidirectional power device are basically identical to those of the first embodiment, and will not be repeatedly described in particular structure.

Fourth Embodiment

A technical solution according to this embodiment is basically identical to that of the first embodiment. Compared with the first embodiment, this embodiment further comprises a routing layer 70 (not illustrated in the figure) and a plurality of metal solder balls 80 arranged on the routing layer 70.

Since a distance between the trenches 20 is small, a gate electrode led from a plurality of trenches structure is relatively narrow, making a parasitic resistance very large. To reduce the parasitic resistance, the routing layer 70 is further arranged on the power device provided in the first embodiment.

Figure 8:
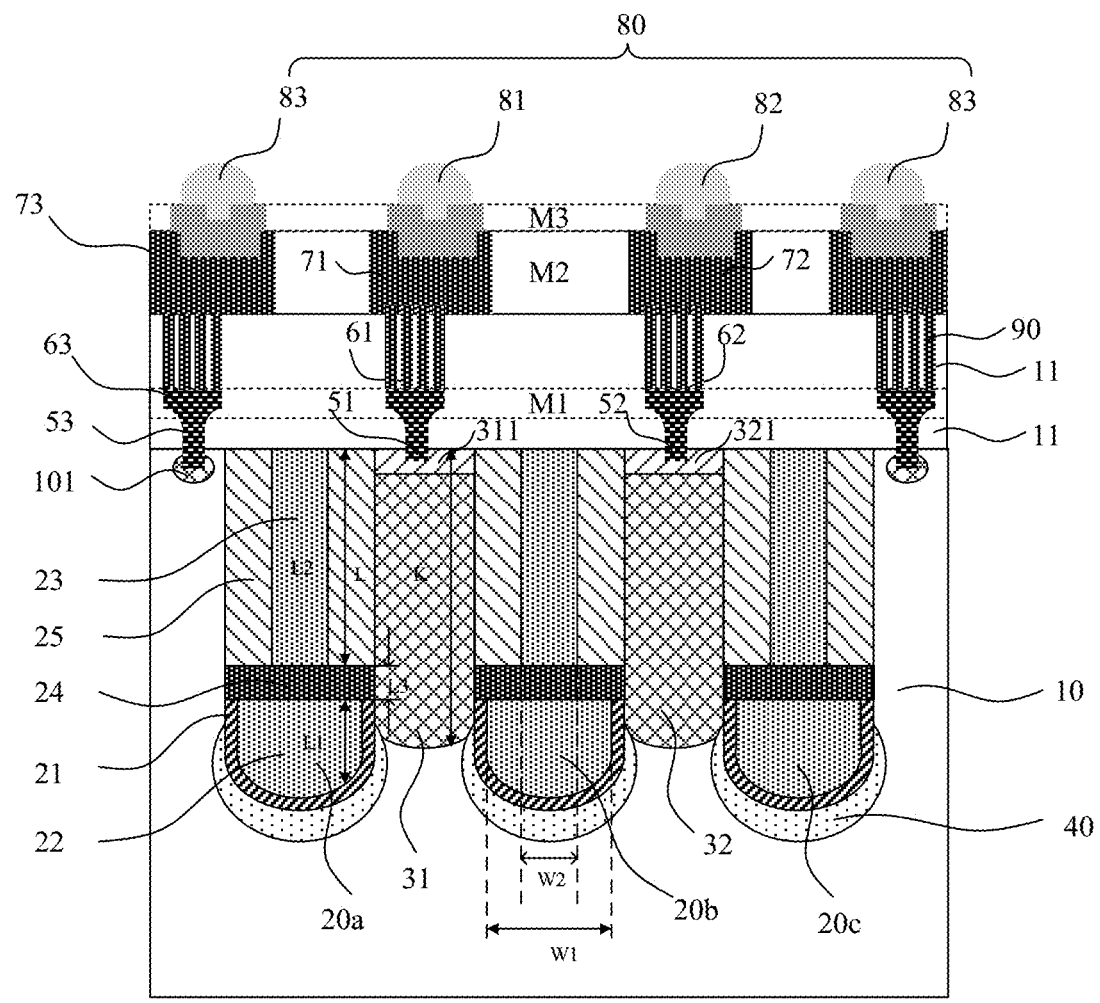
FIG. 8 illustrates a sectional view of a bidirectional power device according to a fourth embodiment of the present disclosure.
Figure 9:
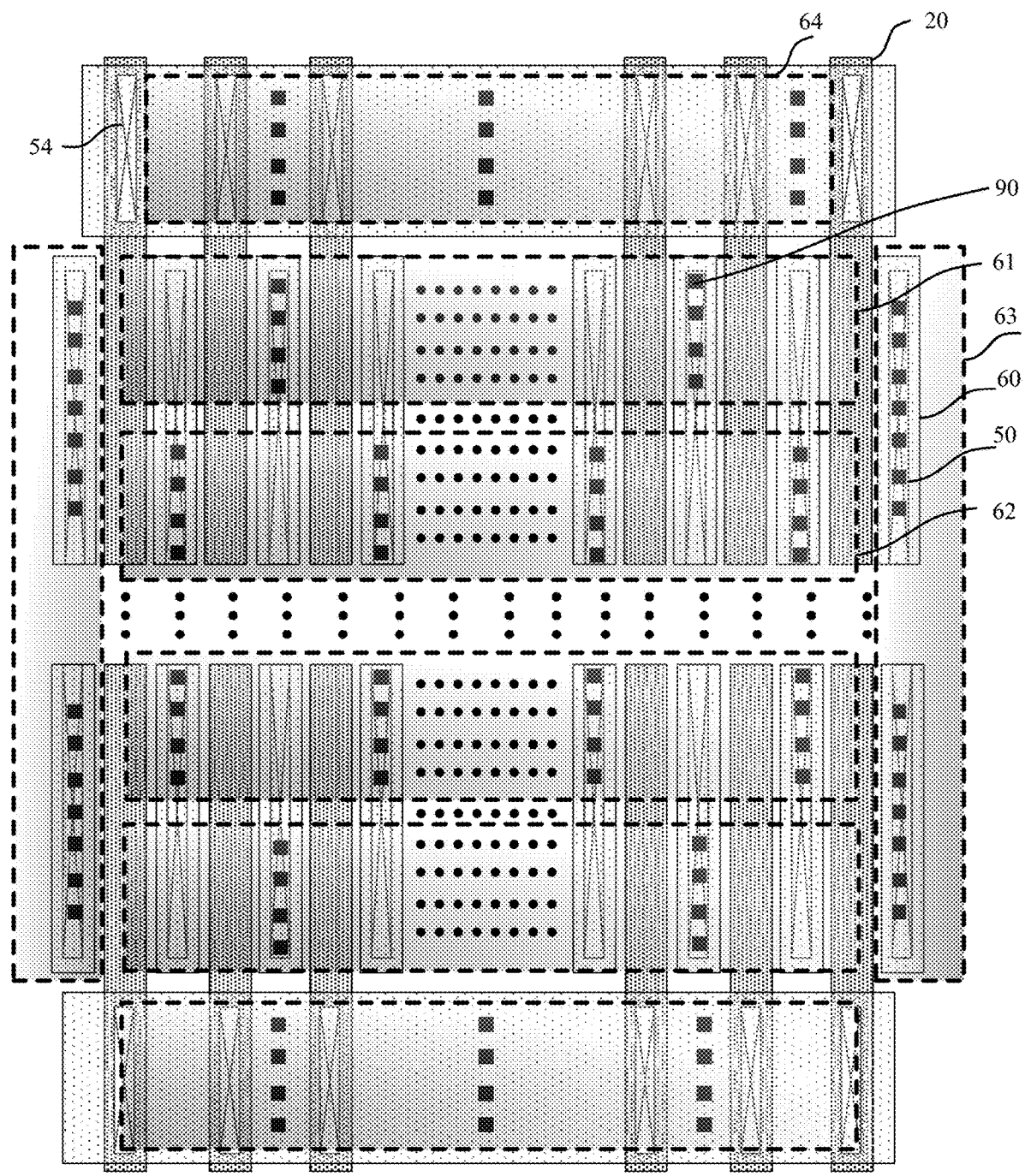
FIG. 9 illustrates a top view of the bidirectional power device according to the fourth embodiment of the present disclosure.

As shown in FIG. 8 and FIG. 9, the routing layer 70 (not illustrated in the figure) is located on a surface of the power device, and are configured to lead a first output electrode S1, a second output electrode S2, a substrate electrode Sub and a gate electrode G, which are formed by a first contact 61, a second contact 62, a third contact 63 and a fourth contact 64, respectively, to the surface of the power device.

The first contact 61, the second contact 62, one or more third contacts 63 and the fourth contact 64 are located in a metal layer M1, the routing layer 70 is located in a second metal layer M2, and the first metal layer M1 is isolated from the second metal layer M2 by an overlay dielectric layer 11. The routing layer 70 is electrically connected to the first contact 61, the second contact 62, the third contact 63 and the fourth contact 64 through a plurality of conductive vias 90. The routing layer 70 includes a first wire 71, a second wire 72, a third wire 73 and a fourth wire 74 (not illustrated in the figure). The first wire 71 is electrically connected to the first contact 61, the second wire 72 is electrically connected to the second contact 62, the third wire 73 is electrically connected to the corresponding third contact 63, and the fourth wire 74 is electrically connected to the fourth contact 64.

In this embodiment, the routing layer 70 is connected to a wider metal wire so as to reduce a parasitic resistance of the corresponding metal layer.

The plurality of metal solder balls 80 are located on the routing layer 70, and are electrically connected to the first output electrode S1, the second output electrode S2, the substrate electrode Sub and the gate electrode G, respectively, through the routing layer 70. The metal solder balls 80 includes a metal solder ball 81 electrically connected to the first output electrode S1, a metal solder ball 82 electrically connected to the second output electrode S2, a metal solder ball 83 electrically connected to the substrate electrode Sub and a metal solder ball 84 (not illustrated in the figure) electrically connected to the gate electrode G.

In this embodiment, a bumping process is adopted to form the plurality of metal solder balls 80 on the routing layer, and a chip scale package is completed. The metal solder ball 81 is used as a pad which connects the first output electrode S1 to external components, the metal solder ball 82 is used as a pad which connects the second output electrode S2 to external components, the metal solder ball 83 is used as a pad which connects the substrate electrode to external components, and the metal solder ball 84 is used as a pad which connects the gate electrode to external components.

In a preferable embodiment, an electroplated metal layer M3 is further formed between the metal solder balls 80 and the routing layer 70, so as to make bonding between each metal solder ball 80 and the routing layer 70 firmer.

Figure 10:
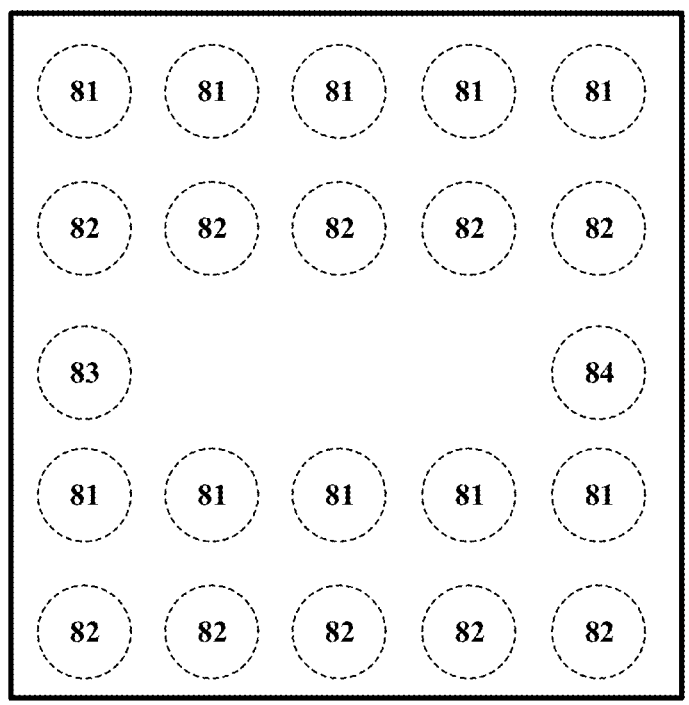
FIG. 10 illustrates a schematic diagram showing packaging pins of the bidirectional power device according to the fourth embodiment of the present disclosure.

Since a relatively-large current passes through the first output electrode S1 and the second output electrode S2, a relatively-large number of the metal solder balls 81 and 82 are distributed, as shown in FIG. 10, the plurality of metal solder balls 81 are connected together in parallel, the plurality of metal solder balls 82 are connected together in parallel, such that current distribution between the power device and an external system may be improved.

Due to the bumping process adopted in the fourth embodiment, a wire bonding process used in conventional packaging is omitted, a parasitic inductance and a parasitic resistance of the packaging are reduced, and a packaging resistance of the power device is reduced; and due to an absence of encapsulation with a molding compound, it is much easier to achieve heat dissipation, the power consumption is reduced, and the reliability and safety of the power device are improved.

Fifth Embodiment

FIGS. 11*a*-11*i* illustrate sectional views of different stages of a method for manufacturing a bidirectional power device according to the fifth embodiment of the present disclosure.

Figure 11A:
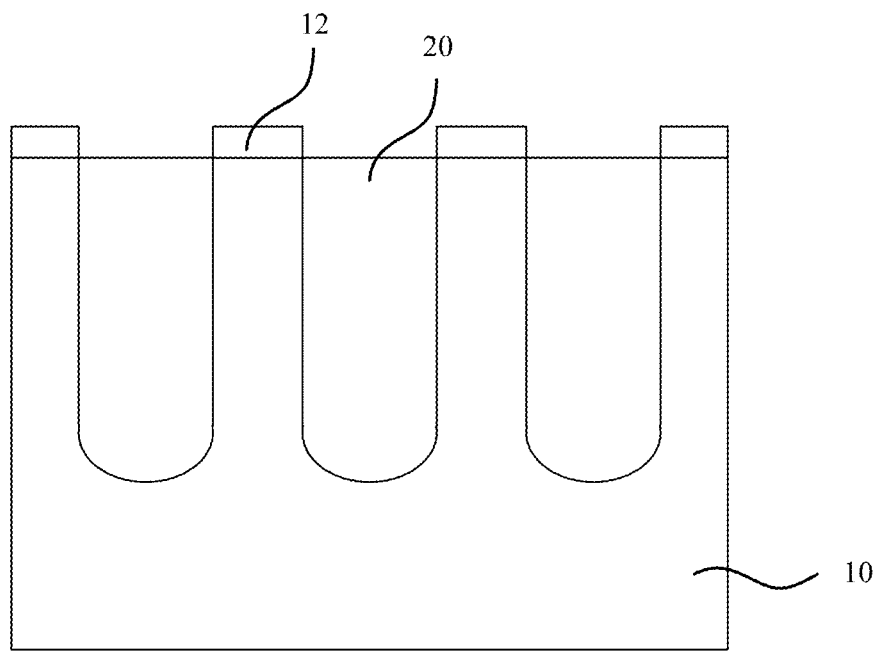
FIGS. 11a to 11i illustrate sectional views in different stages of a method for manufacturing a bidirectional power device according to a fifth embodiment of the present disclosure.
Figure 11B:
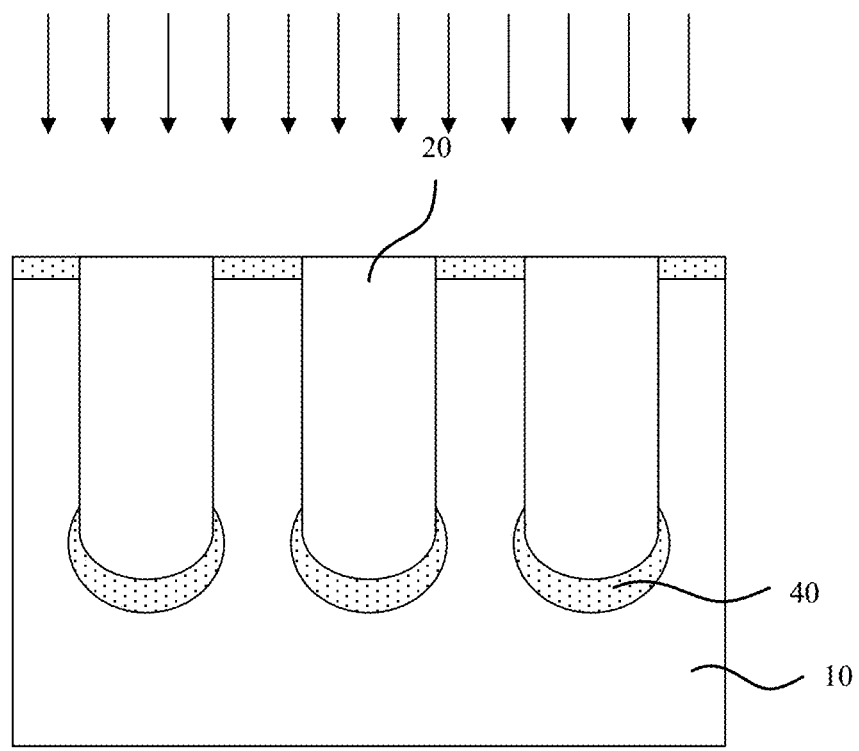

As shown in FIG. 11*a*, a basic structure of the method for manufacturing the bidirectional power device according to the fifth embodiment of the present disclosure is illustrated. The step for forming the structure comprises: forming a barrier layer 12 on a surface of a semiconductor layer 10 by deposition; forming an etching window by photoetching, and forming a plurality of trenches 20 by etching the barrier layer 12 and the semiconductor layer 10 through the etching window. A depth of each of the plurality of trenches 20 reaches 1.2~2.0 μm.

In this embodiment, the semiconductor layer 10 is, for example, a semiconductor substrate itself, an epitaxial layer formed on the semiconductor substrate or a well region implanted in the semiconductor substrate. A doping concentration of the semiconductor layer 10 is $7E14{\sim}3E16$ cm$^{-3}$. The barrier layer 12 may be silicon dioxide, silicon nitride or a composite structure of silicon dioxide and silicon nitride. The semiconductor layer 10 is, for example, a silicon substrate, or an epitaxial layer formed on the silicon substrate, or a well region formed in the silicon substrate, and has a doping type of P. The semiconductor layer 10 has a same doping type as that of the silicon substrate.

As shown in 11*b*, the barrier layer 12 on the surface of the semiconductor layer 10 is removed, sacrificial oxidation process is performed to repair a surface of each of the plurality of trenches 20, and a sacrificial oxidation thickness is about 300~1,000 angstroms; and then ions of a first conduction type are implanted to form a channel region 40.

In this embodiment, the first conduction type is P type, the implanted ions of the first conduction type are boron (B) or boron fluoride (BF$_2$) ions, and an implantation dosage is $5E11{\sim}2E13$ ions/cm$^2$.

Figure 11C:
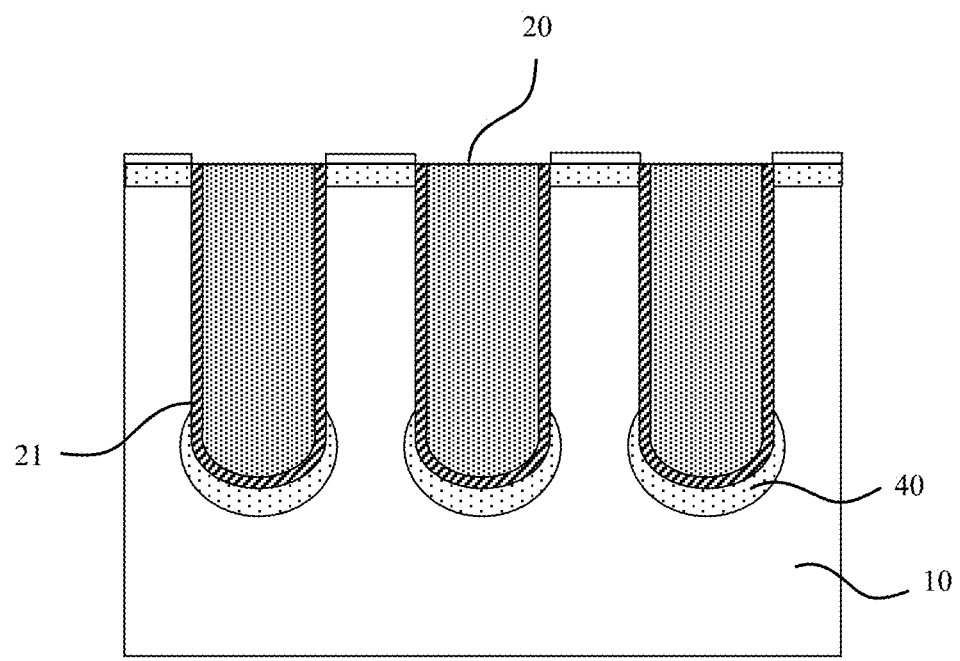

As shown in FIG. 11*c*, a gate dielectric layer 21 is grown on the surface of each of the plurality of trenches 20, and then polycrystalline silicon is deposited on a surface of the gate dielectric layer 21. By performing a chemical mechanical polishing (CMP) process, the polycrystalline silicon on the surface of the semiconductor layer 10 is removed, and a surface of the polycrystalline silicon in each of the plurality of trenches 20 is flush with the surface of the semiconductor layer 10.

In this embodiment, the gate dielectric layer 21 is made from silicon dioxide or silicon nitride, and has a thickness of 200~1,000 angstroms. A thickness of deposition of the polycrystalline silicon is 5,000~10,000 angstroms.

Figure 11D:
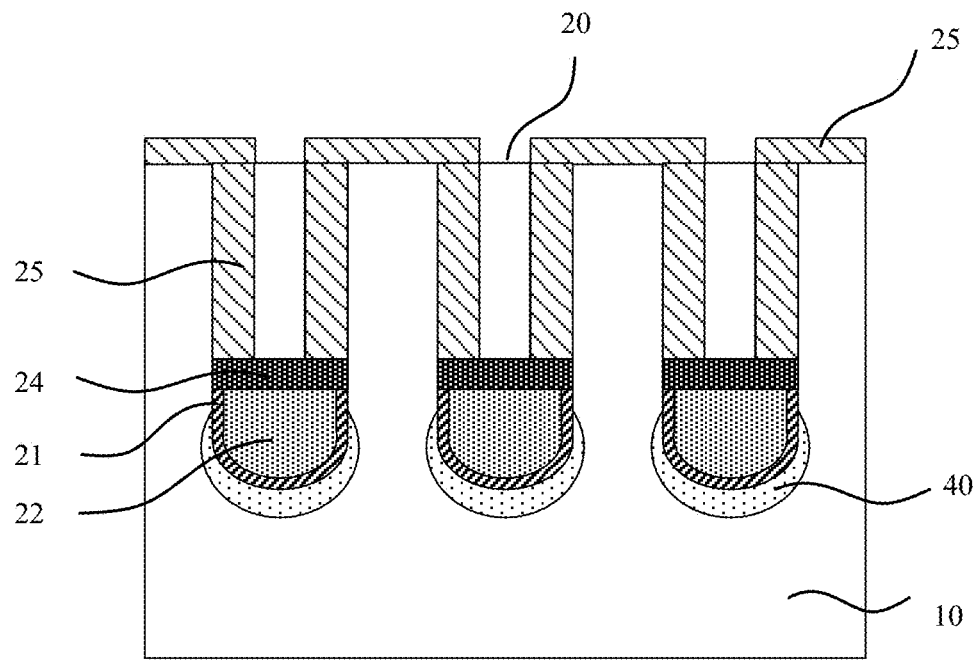

As shown in FIG. 11*d*, an etch-back window is formed by photoetching. Part of the polycrystalline silicon in each of the plurality of trenches 20 is etched according to the etch-back window, the remaining polycrystalline silicon forms a control gate 22, and a depth of etch-back is 0.6~1.2 μm. Then by a growing or deposition manner, an isolation layer 24 is formed above the control gate 22, and the shield dielectric layer 25 is formed on the remaining surface in each of the plurality of trenches 20 and the surface of the semiconductor layer 10. The shield dielectric layer 25 and the isolation layer 24 may be made from silicon dioxide, silicon nitride or a composite structure of silicon dioxide and silicon nitride. Thicknesses of the shield dielectric layer 25 and the isolation layer 24 are 1,000~2,500 angstroms, namely 0.1~0.25 μm.

Figure 11E:
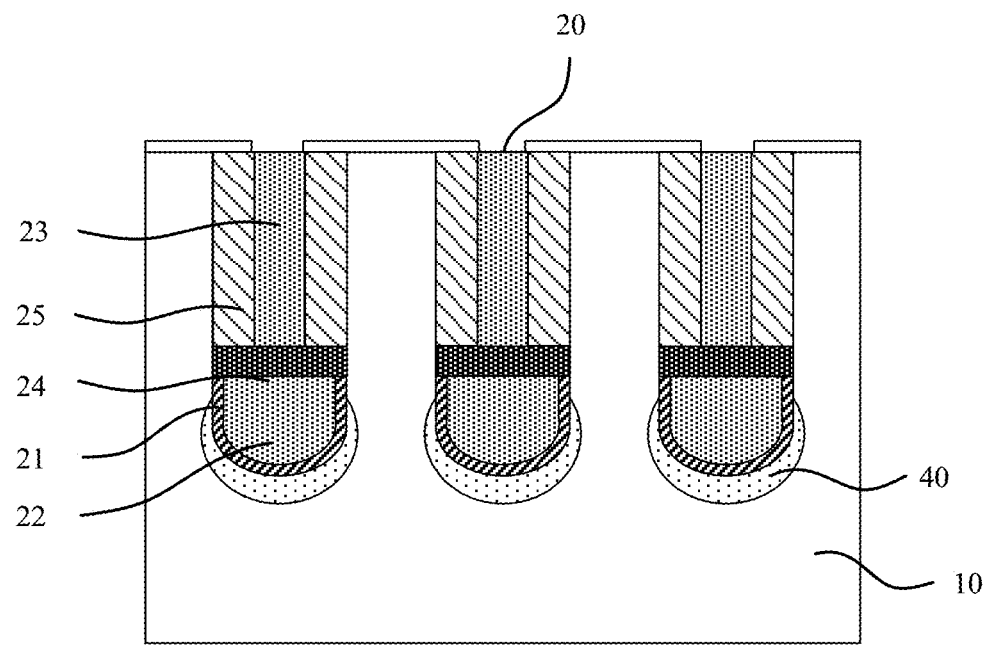

As shown in FIG. 11*e*, polycrystalline silicon is deposited on a surface of the shield dielectric layer 25 in each of the plurality of trenches 20. After CMP is performed, the polycrystalline silicon on the surface of the semiconductor layer is removed, the polycrystalline silicon in each of the plurality of trenches 20 is flush with the shield dielectric layer 25 on the surface of the semiconductor layer 10, and the shield gate 23 is formed by etching back the polycrystalline silicon. A distance between the shield gate 23 and the surface of the semiconductor layer is 1,000~1,500 angstroms, namely 0.1~0.15 μm. Then the shield dielectric layer 25 on the surface of the semiconductor layer 10 is removed, and part of the shield dielectric layer 25 is remained to serve as a barrier layer for subsequent implantation process. A thickness of the remained shield dielectric layer is 200~500 angstroms.

Figure 11F:
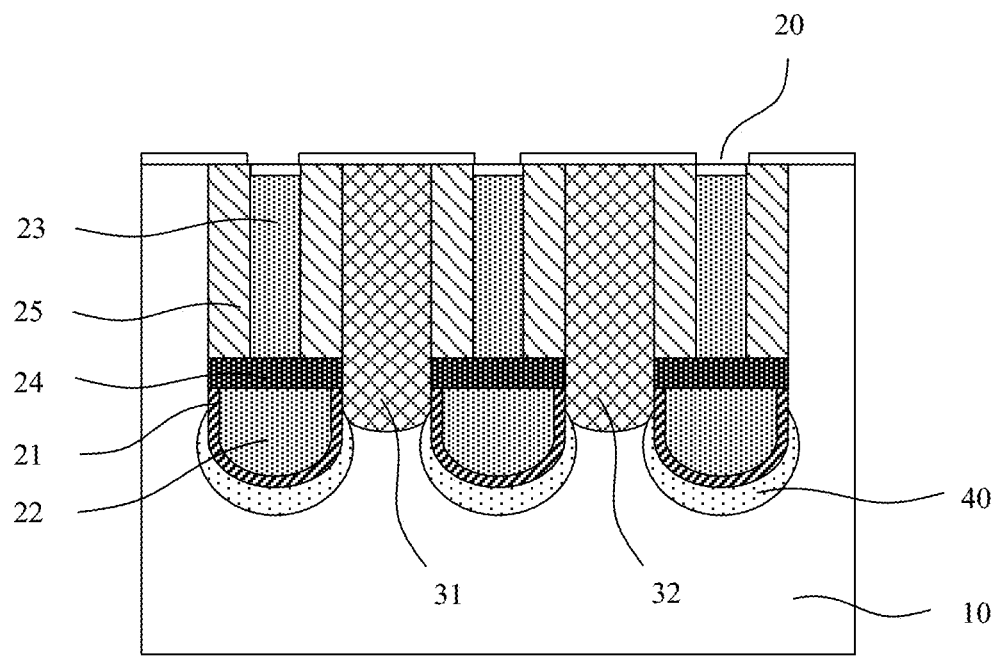

As shown in FIG. 11*f*, an implantation window is formed by photoetching, ions of a second conduction type are implanted according to the implantation window, followed by an anneal at a temperature of 1,000° C.~1,150° C. for reducing damage, a source region 31 and a drain region 32 are formed.

In this embodiment, the second conduction type is N type, the implanted ions of the second conduction type are phosphorus (P) ions, and an implantation dosage is $1E13{\sim}6E13$ ions/cm$^2$.

Figure 11G:
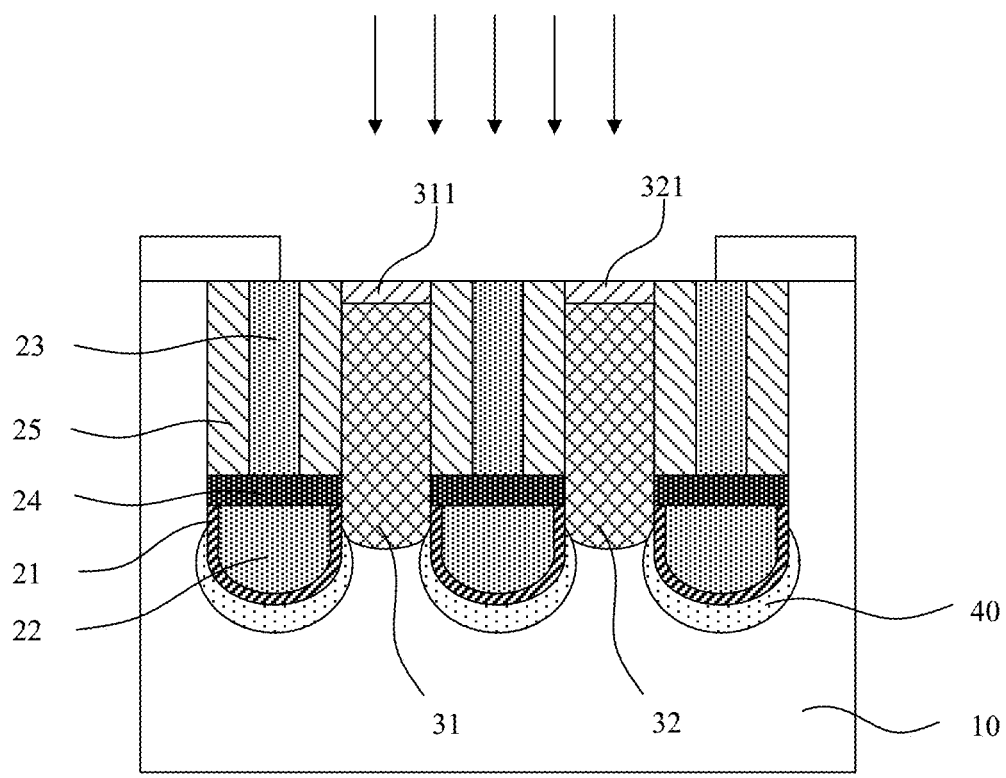

As shown in FIG. 11*g*, ions of the second conduction type are implanted in the source region 31 and the drain region 32, followed by a rapid anneal or an anneal at a temperature of 800° C.~1,000° C. for reducing damage, a first contact region 311 and a second contact region 321 are formed. A doping concentration of the first contact region 311 is greater than that of the source region 31, and a doping concentration of the second contact region 321 is greater than that of the drain region 32.

In this embodiment, the second conduction type is N type, the implanted ions of the second conduction type are phosphorus (P) or arsenic (As) ions, and an implantation dosage is 1E15~1E16 ions/cm$^2$.

Figure 11H:
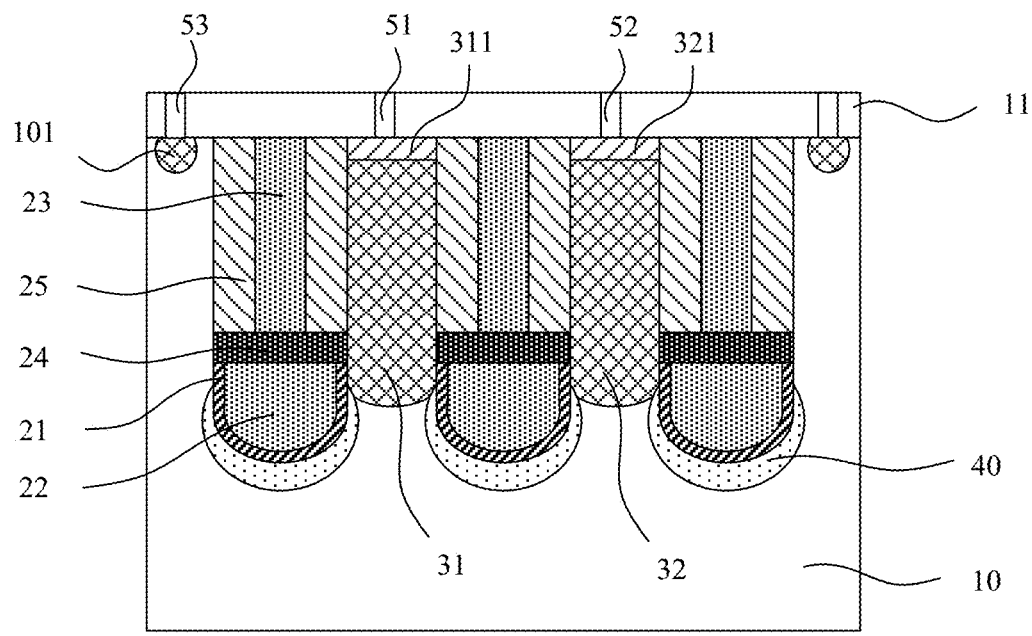

As shown in FIG. 11h, the ions of the first conduction type are implanted in the semiconductor layer 10 to form a third contact region 101. A doping concentration of the third contact region 101 is greater than that of the semiconductor layer 10. Undoped silicate glass (USG) and borophosphosilicate glass (BPSG) are deposited on the surface of the semiconductor layer 10 to form an overlay dielectric layer 11, the overlay dielectric layer 11 is etched to form through holes 50 (not illustrated in the figure), comprising a through hole 51 and a through hole 52 which are in contact with the source region 31 and the drain region 32, respectively, a through hole 53 in contact with the semiconductor layer 10, and a through hole 54 (not illustrated in the figure) in contact with the contact gate 22 and/or the shield gate 23 in each of the plurality of trenches 20. The first through hole 51 is in contact with the source region 31 through the first contact region to form the first output electrode S1, and the second through hole 52 is in contact with the drain region 32 through the second contact region to form the second output electrode S2. Each through hole 50 extends to a position 0.1~0.5 μm below the surface of the semiconductor layer 10.

In this embodiment, the first conduction type is P type, the implanted ions of the first conduction type are boron (B) or boron fluoride (BF$_2$) ions, and an implantation dosage is 5E14~8E15 ions/cm$^2$.

Figure 11I:
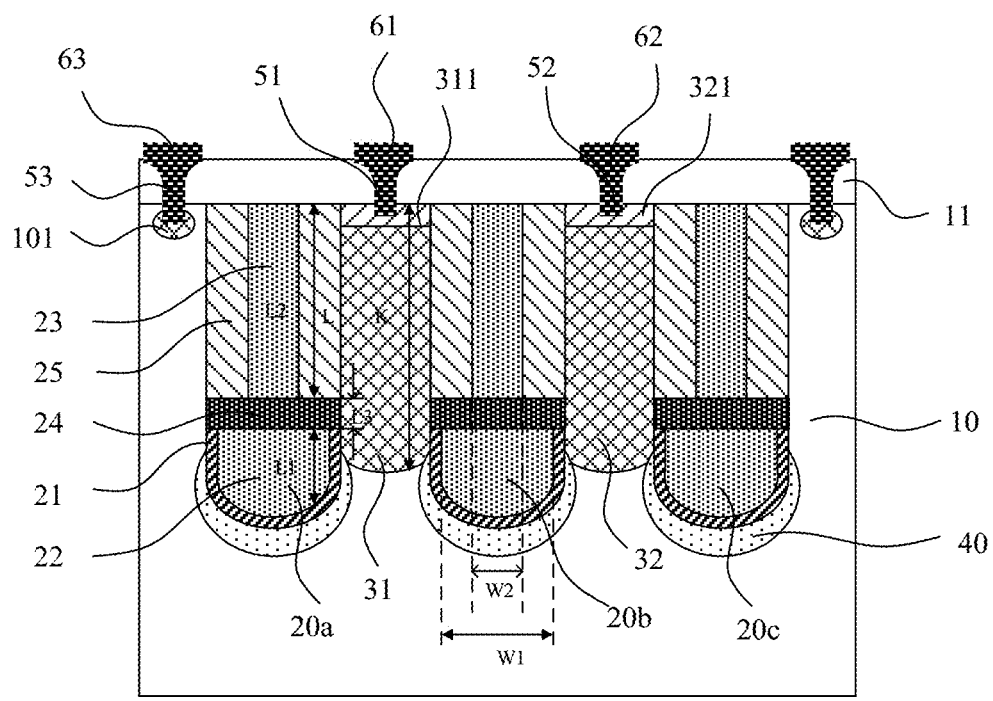

As shown in FIG. 11i, a metal layer 60 is deposited in the through holes 50 to form surface electrodes, that is, to form a first contact 61, a second contact 62, a third contact 63 and a fourth contact 64 (not illustrated in the figure).

In this embodiment, the first contact 61 serves as the first output electrode S1, the second contact 62 serves as the second output electrode S2, the third contact 63 serves as a substrate electrode Sub and the fourth contact 64 serves as a gate electrode G. The fourth contact 64 is electrically connected to the control gate 22 and the shield gate 23, thus the control gate 22 and the shield gate 23 are connected together through the fourth contact 64.

Sixth Embodiment

A technical solution according to this embodiment is basically identical to that of the fifth embodiment except for the step for forming a third contact 63. According to this embodiment, for forming a third contact 63, a substrate 1 is formed on a second surface of a semiconductor layer 10, then the third contact 63 is formed by an evaporation process of a metal layer forming a metal layer 60 at a back surface of the substrate 1, and then a substrate electrode is formed by the third contact 63. For example, in the step for forming the third contact, the metal layer 60 may be made from titanium nickel silver, or titanium nickel gold by a conventional process, etc.

In this embodiment, the other steps of the method for manufacturing the bidirectional power device are basically identical to those of the fifth embodiment, and will not be repeatedly described in particular structure.

Seventh Embodiment

A technical solution according to this embodiment is basically identical to that of the fifth embodiment. Compared with the fifth embodiment, this embodiment further includes a step for forming a routing layer 70 on a surface of the power device. A first output electrode S1, a second output electrode S2, a substrate electrode Sub and a gate electrode G formed by a first contact 61, a second contact 62, a third contact 63 and a fourth contact 64, respectively, are led to the surface of the power device. This embodiment further includes a step for forming a plurality of metal solder balls 80 on the routing layer. The plurality of metal solder balls 80 are electrically connected to the substrate electrode Sub, the first output electrode S1, the second output electrode S2 and the gate electrode G through the routing layer 70.

The first contact 61, the second contact 62 and the third contact 63 are located in a first metal layer M1, the routing layer 70 is located in a second metal layer M2, the first metal layer M1 is isolated from the second metal layer M2 by an overlay dielectric layer 11, and the routing layer 70 is electrically connected to the first contact 61, the second contact 62 and the third contact 63 through a plurality of conductive vias 90.

In this embodiment, the routing layer 70 is connected to a wider metal wire so as to reduce a parasitic resistance of the corresponding metal layer. A bumping process is adopted to form the plurality of metal solder balls 80 on the routing layer, and a chip scale package is completed.

In this embodiment, a doping type of a semiconductor layer 10 is a first doping type, doping types of a source region 31 and a drain region 32 are a second doping type, the first doping type may be P doping type, the second doping type may be N doping type, thus an N-type bidirectional power device may be formed.

In an alternative embodiment, the doping type of the semiconductor layer 10 can be exchanged with the doping types of the source region 31 and the drain region 32, that is, the first doping type may be N doping type, the second doping type may be P doping type, thus a P-type bidirectional power device may be formed.

According to the embodiments of the present disclosure, stated above, these embodiments do not describe all details and do not limit the present invention to the particular embodiments described. Apparently, based on the description above, many modifications and changes may be made. Selection and particular description of these embodiments in the specification are merely used for better explaining a principal and an actual application of the present disclosure, such that those skilled in the art can utilize the present disclosure well and use through changes on the basis of the present disclosure. The present disclosure is merely limited by the appended claims and the scope and equivalents thereof.

What is claimed is:

1. A bidirectional power device, comprising:
   a semiconductor layer;
   a plurality of trenches located in the semiconductor layer;
   a gate dielectric layer located on an inner wall of each of the plurality of trenches;
   a control gate located at a lower portion of each of the plurality of trenches;
   a shield gate located at an upper portion of each of the plurality of trenches;
   an isolation layer located between the control gate and the shield gate;
   a source region and a drain region which are located in the semiconductor layer and are adjacent to the shield gate;
   a first contact, being in contact with the source region to form a first output electrode;
   a second contact, being in contact with the drain region to form a second output electrode;

a third contact, being in contact with the semiconductor layer to form a substrate electrode; and
a fourth contact, being in contact with the control gate and/or the shield gate to form a gate electrode,
wherein the control gate is isolated from the semiconductor layer by the gate dielectric layer.

2. The bidirectional power device according to claim 1, further comprising:
a channel region which is located in the semiconductor layer and is adjacent to the control gate.

3. The bidirectional power device according to claim 1, wherein the source region and the drain region extend from a first surface of the semiconductor layer and overlap with the control gate.

4. The bidirectional power device according to claim 2, wherein a doping type of the semiconductor layer is a first doping type, doping types of the source region and the drain region are a second doping type, a doping type of the channel region is the first doping type or the second doping type, and the first doping type is contrary to the second doping type.

5. The bidirectional power device according to claim 1, further comprising a shield dielectric layer located on an inner wall of each of the plurality of trenches, wherein the shield gate is isolated from the semiconductor layer by the shield dielectric layer.

6. The bidirectional power device according to claim 5, wherein a thickness of the shield dielectric layer is greater than or equal to that of the gate dielectric layer.

7. The bidirectional power device according to claim 1, wherein a width of the control gate is greater than that of the shield gate.

8. The bidirectional power device according to claim 1, wherein the source region and the drain region each have a length greater than a sum of a length of the shield gate and a length of the isolation layer, and less than a sum of the length of the shield gate, the length of the isolation layer and a length of the control gate.

9. The bidirectional power device according to claim 1, wherein the semiconductor layer is one selected from a semiconductor substrate, an epitaxial layer formed on the semiconductor substrate or a well region implanted in the semiconductor substrate.

10. The bidirectional power device according to claim 1, further comprising:
a first contact region, located in the source region, wherein a doping concentration of the first contact region is greater than that of the source region;
an overlay dielectric layer, located on a first surface of the semiconductor layer; and
a first through hole, penetrating through the overlay dielectric layer to extend to the source region;
wherein the first contact is in contact with the source region through the first through hole and the first contact region.

11. The bidirectional power device according to claim 10, further comprising:
a second contact region, located in the drain region, wherein a doping concentration of the second contact region is greater than that of the drain region; and
a second through hole, penetrating through the overlay dielectric layer to extend to the drain region;
wherein the second contact is in contact with the drain region through the second through hole and the second contact region.

12. The bidirectional power device according to claim 11, further comprising:
a third contact region, located in the semiconductor layer and proximal to the first surface of the semiconductor layer, wherein a doping concentration of the third contact region is greater than that of the semiconductor layer; and
a third through hole, penetrating through the overlay dielectric layer to extend to the semiconductor layer;
wherein the third contact is in contact with the semiconductor layer through the third through hole and the third contact region.

13. The bidirectional power device according to claim 11, further comprising:
a fourth through hole, penetrating through the overlay dielectric layer to extend to the control gate and/or the shield gate.

14. The bidirectional power device according to claim 1, further comprising:
a routing layer, comprising a first wire, a second wire, a third wire and a fourth wire, which are electrically connected to the first output electrode, the second output electrode, the substrate electrode and the gate electrode, respectively, through a plurality of conductive vias.

15. The bidirectional power device according to claim 14, further comprising:
a plurality of metal solder balls, which are located on the routing layer, and are electrically connected to the first output electrode, the second output electrode, the substrate electrode and the gate electrode through the routing layer.

16. The bidirectional power device according to claim 1, wherein the shield gate is electrically connected to the control gate.

17. The bidirectional power device according to claim 1, wherein the shield gate is electrically connected to the semiconductor layer.

18. The bidirectional power device according to claim 1, wherein when the bidirectional power device is turned on, the substrate electrode is electrically connected to either of the first output electrode and the second output electrode to select a direction of a current from two direction.

19. The bidirectional power device according to claim 18, wherein when the substrate electrode is electrically connected to the first output electrode, the current flows from the second output electrode to the first output electrode;
when the substrate electrode is electrically connected to the second output electrode, the current flows from the first output electrode to the second output electrode.

20. A bidirectional power device, comprising a plurality of cell structures, each one of the plurality of cell structures is the bidirectional power device according to claim 1; and
the source regions in the plurality of the cell structures are electrically connected together, and drain regions in the plurality of the cell structures are electrically connected together.

21. The bidirectional power device according to claim 1, wherein the plurality of trenches comprises a first trench and a third trench outside the source region and the drain region, so that a substrate electrode is formed adjacent to the first trench and/or the third trench.

22. The bidirectional power device according to claim 1, wherein the source region and the drain region are capable of being exchanged with each other.

* * * * *